(12) United States Patent
Kiyota et al.

(10) Patent No.: US 7,253,356 B2
(45) Date of Patent: Aug. 7, 2007

(54) WATERPROOF STRUCTURE OF JUNCTION BOX

(75) Inventors: Hirotaka Kiyota, Shizuoka (JP);
Yoshihiko Nakahama, Aichi (JP);
Kazuhiro Kusuyama, Aichi (JP)

(73) Assignee: Yazaki Corporation, Tokyo (JP)

( * ) Notice: Subject to any disclaimer, the term of this patent is extended or adjusted under 35 U.S.C. 154(b) by 23 days.

(21) Appl. No.: 11/019,119

(22) Filed: Dec. 22, 2004

(65) Prior Publication Data

US 2005/0194167 A1    Sep. 8, 2005

(30) Foreign Application Priority Data

Dec. 22, 2003   (JP) .............................. 2003-424446

(51) Int. Cl.
*H02G 3/08*     (2006.01)
*H05K 7/20*     (2006.01)
(52) U.S. Cl. ................... 174/17 VA; 174/50; 174/53; 174/17 R; 361/676; 361/678; 361/688; 439/76.2
(58) Field of Classification Search ............... 174/52.1, 174/67, 66, 57, 59, 50, 53, 58, 17 VA, 17 R, 174/520; 220/3.4, 3.5, 3.6, 3.7, 3.8, 3.9, 220/4.02, 3.2, 3.3; 439/76.1, 76.2, 535; 361/600, 361/676, 677, 678, 687, 688, 689, 690, 692, 361/724

See application file for complete search history.

(56) References Cited

U.S. PATENT DOCUMENTS

| | | | | |
|---|---|---|---|---|
| 4,019,005 A | * | 4/1977 | Michetti | 218/149 |
| 4,772,759 A | * | 9/1988 | Roy et al. | 174/17 VA |
| 4,979,634 A | * | 12/1990 | Begley | 220/242 |
| 5,245,507 A | * | 9/1993 | Ericksen | 361/641 |
| 5,527,993 A | * | 6/1996 | Shotey et al. | 174/67 |
| 5,650,591 A | * | 7/1997 | Matsushita et al. | 174/17 VA |
| 5,773,755 A | * | 6/1998 | Iwatare | 174/17 VA |
| 6,133,531 A | * | 10/2000 | Hayduke et al. | 174/67 |
| 6,678,156 B2 | * | 1/2004 | Moizer | 361/690 |
| 6,756,543 B1 | * | 6/2004 | Kaloustian | 174/50 |
| 7,031,154 B2 | * | 4/2006 | Bash et al. | 361/690 |
| 7,189,918 B2 | * | 3/2007 | Sakata | 174/17 VA |

FOREIGN PATENT DOCUMENTS

| | | |
|---|---|---|
| JP | 63-131519 | 8/1988 |
| JP | 1-24952 | 7/1989 |
| JP | 1-167082 | 11/1989 |
| JP | 3-34618 | 4/1991 |
| JP | 10-126921 | 5/1998 |
| JP | 11-215653 | 8/1999 |

* cited by examiner

*Primary Examiner*—Angel R. Estrada
(74) *Attorney, Agent, or Firm*—Armstrong, Kratz, Quintos, Hanson, & Brooks, LLP.

(57) ABSTRACT

A waterproof housing of a junction box has at least one vent piece penetrating through a wall of the housing for ventilation of the junction box. The vent piece has an inner wall formed with a baffle projection to prevent invasion of a splashing water. The waterproof housing has a plurality of the vent pieces. The waterproof housing also has a drain hole provided in the housing. The vent piece has an inside opening positioned higher than the drain hole when the junction box is mounted at a usage position. The baffle projection is positioned at an axial inner end portion of the vent piece. The vent piece has a central axis inclined relative to an invasion direction of an expected splashing water.

3 Claims, 4 Drawing Sheets

WATERPROOF STRUCTURE OF JUNCTION BOX

BACKGROUND OF THE INVENTION

1. Field of the Invention

The present invention relates to a waterproof structure of a junction box used for connection of electrical wiring harnesses. The structure has an improved performance in heat transfer and waterproofness.

2. Background Art

Conventionally, a junction box mounted in an engine room of an automobile vehicle has a waterproof structure to prevent invasion of water into the box during vehicle washing with water jet, running in a rain, etc. However, a completely closed housing is not preferable, since a drainage caused by a temperature difference between the inside and the outside of the box can not be discharged from the box to have an adverse effect on electrical parts in the box. Therefore, the junction box mounted in the engine room has a construction allowing discharge of an inside drainage of the box as well as waterproofness against invasion of external water.

FIGS. 5 and 6 show conventional ones of such junction boxes, which are disclosed in Japanese Utility Model Application Laid-open No. H-1-24952 or Japanese Patent Application Laid-open No. H-10-126921. FIG. 5 shows a junction box 40 having a simple construction for preventing water invasion. The construction includes a lower cover 41 having a bottom wall 41a formed with a drain hole 42, a base (not shown) supporting the lower cover 41, and a seat structure (not shown) in a vehicle side to receiving the base. The construction defines an air flow passage 43 providing a venturi cooperating with the drain hole 42. The air flow passage 43 extends substantially parallel to an advancing direction of the vehicle.

In the above-mentioned construction, air flows through the air flow passage 43 during running of the vehicle to generate a negative pressure near the drain hole 42 communicating with the air flow passage 43. This discharges a drainage puddle in the lower cover 41 and prevents invasion of external water into the lower cover 41.

FIG. 6 shows another conventional junction box 45 disclosed in Japanese Patent Application Laid-open No. H-10-126921. The junction box 45, which is shown upside-down, has a drain hole 47 to easily discharge an inner drainage. The drain hole 47 has a sectional area enough to prevent blocking due to an interfacial force of the drainage. Around the drain hole 47, there are provided a pair of ribs 48 each having a round forward end.

Each rib 48 is semi-circular and extends from each side of the drain hole 47 having a square section. The ribs 48 guide a drainage flowing along an inclined inner wall of the lower cover 46 to adequately discharge it.

Japanese Patent Application Laid-open No. H-11-215653 discloses further another junction box having a main housing formed with a drain hole. The drain hole is provided with a blocking member for absorbing water invaded from the outside. The blocking member is a sheet or a sponge having water absorption and air permeable functions. The blocking member is disposed to cover the drain hole. The junction box has a lower cover with an inclined bottom along which a drainage flows to gather around the drain hole so as to be absorbed in the blocking member. The absorbed water drops through the drain hole or dries up naturally. Meanwhile, when the junction box receives a jet water during washing of an associated vehicle, the blocking member absorbs or plashes the water, preventing invasion of the water into the lower cover.

Japanese Utility Model Application Laid-open No. S-63-131519 discloses further another junction box having a lower cover with a drain hole that is overlaid by a wall. Japanese Utility Model Application Laid-open No. H-1-167082 discloses further another junction box having a lower cover with a vent hole for transferring heat generated in the box, and the lower cover is provided with a baffle plate to prevent invasion of external water. Japanese Utility Model Application Laid-open No. H-3-34618 discloses further another junction box having a lower cover with a drain hole, and an additional cover with another drain hole is provided such that the latter drain hole is offset from the drain hole of the lower cover.

However, the conventional junction boxes discussed above have problems described below. The lower cover 41 of the first conventional junction box shown in FIG. 5 has no vent hole to transfer heat generated in the lower cover 41, so that a higher temperature in the lower cover has adverse effects on electrical parts in the box. A larger opening of the drain hole 42 will serve to transfer heat but is disadvantageous for waterproofness of the cover 41.

The second conventional junction box shown in FIG. 6 has the lower cover 46 formed with the drain hole 47 to discharge a drainage in the junction box 45. However, the drain hole 47 is not designed to prevent invasion of an external water, which may cause erosion of electric parts in the junction box or undesirable leak of electrical current due to invasion of the water. Like the first one, the lower cover 46 has no vent hole, and the drain hole does not serve to efficiently transfer heat generated in the lower cover 46 to disadvantageously cause a higher temperature in the lower cover 46.

The junction box disclosed in Japanese Utility Model Application Laid-open No. H-1-167082 intends to have waterproofness and ventilation functions. However, the junction box has an additional cover and the baffle plate perpendicular to each other, which defines a labyrinth to insufficiently vent a heated air in the junction box.

SUMMARY OF THE INVENTION

In view of the above-mentioned problems, an object of the invention is to provide a junction box with a waterproof construction allowing transfer of heat generated from electrical parts such as relays and fuses in the box. The construction can also prevent invasion of an external water, improving waterproofness as well as ventilation of the junction box.

For achieving the object, a basic aspect of the invention is a waterproof housing of a junction box, wherein the housing is provided with at least one vent piece penetrating through a wall of the housing for ventilation of the junction box, and the vent piece has an inner wall formed with a baffle projection to prevent invasion of a splashing water.

This configuration allows that heat generated from electrical parts accommodated in the box such as relays and fuses is transferred through the vent piece, preventing a high temperature in the box to keep correct performances of the electric parts. At the same time, a splashing water entering a vehicle engine room through a clearance of a body of the vehicle hits the baffle projection not to enter the box. This prevents corrosion and electrical leak of the electrical parts. Note that the splashing water is brought during jetting water washing of the vehicle or during running of the vehicle on a rainy day. The splashing water hits a wall of a tire recess or a side panel of the vehicle to reach the junction box. This further improves heat transfer and waterproofness of the box.

Preferably, the waterproof housing is provided with a plurality of the vent pieces. This provides narrow opening areas to prevent invasion of the splashing water with sufficient heat transfer of the box, allowing reliable performances of the electrical parts.

Preferably, the waterproof housing further has a drain hole provided in the housing, wherein the vent piece has an inside opening positioned higher than the drain hole when the junction box is mounted at a usage position. Thus, the vent piece having such a length reduces a probability with which the splashing water enters the box. This allows a minimum size of the baffle projection, improving waterproofness of the box with a sufficient heat transfer performance.

Preferably, the baffle projection is positioned at an axial inner end portion of the vent piece. Thereby, the baffle projection partially reduces an opening area of the vent piece.

Preferably, the vent piece has a central axis inclined to an invasion direction of an expected splashing water. Thus, the inclined vent piece improves the waterproofness of the junction box, since the baffle projection can prevent a splashing water from advancing vertically upward. This improves waterproofness of the box with a sufficient heat transfer performance.

DETAILED DESCRIPTION OF THE PREFERRED EMBODIMENTS

Referring to the accompanied drawings, an embodiment of the present invention will be discussed in detail. FIGS. 1 to 4 show an embodiment of a junction box according to the present invention.

The junction box is also called as a relay box or a fuse box. The junction box has a housing accomodating electric parts such as relays, fuses, and connectors. The housing also receives circuit conductors including busbars, electronic units, etc. In an automotive vehicle, the junction box is positioned between a battery and electrical equipment for power supply to the equipment and for controlling the equipment including actuators and instruments. In the embodiment, the junction box mainly includes relays, which does not intend to limit the present invention. The junction box associated with the present invention may accommodate other electrical parts.

A relay box may be disposed in a vehicle cabin, but the present invention relates to a relay box 10 disposed in a vehicle engine room 32 influenced by an external water. Closure of a bonnet does not provide a completely closed space of the engine room 32. Therefore, raindrops may enter between a tire recess wall 36 and the relay box 10 during running of the vehicle on a rainy day. Furthermore, during washing of the vehicle, a high pressure cleaning water may enter through a space along the tire recess wall 36 or through a radiator grill of the vehicle. Moreover, the engine room 32 itself may be washed by a high pressure water with the bonnet being open.

Figure 4:
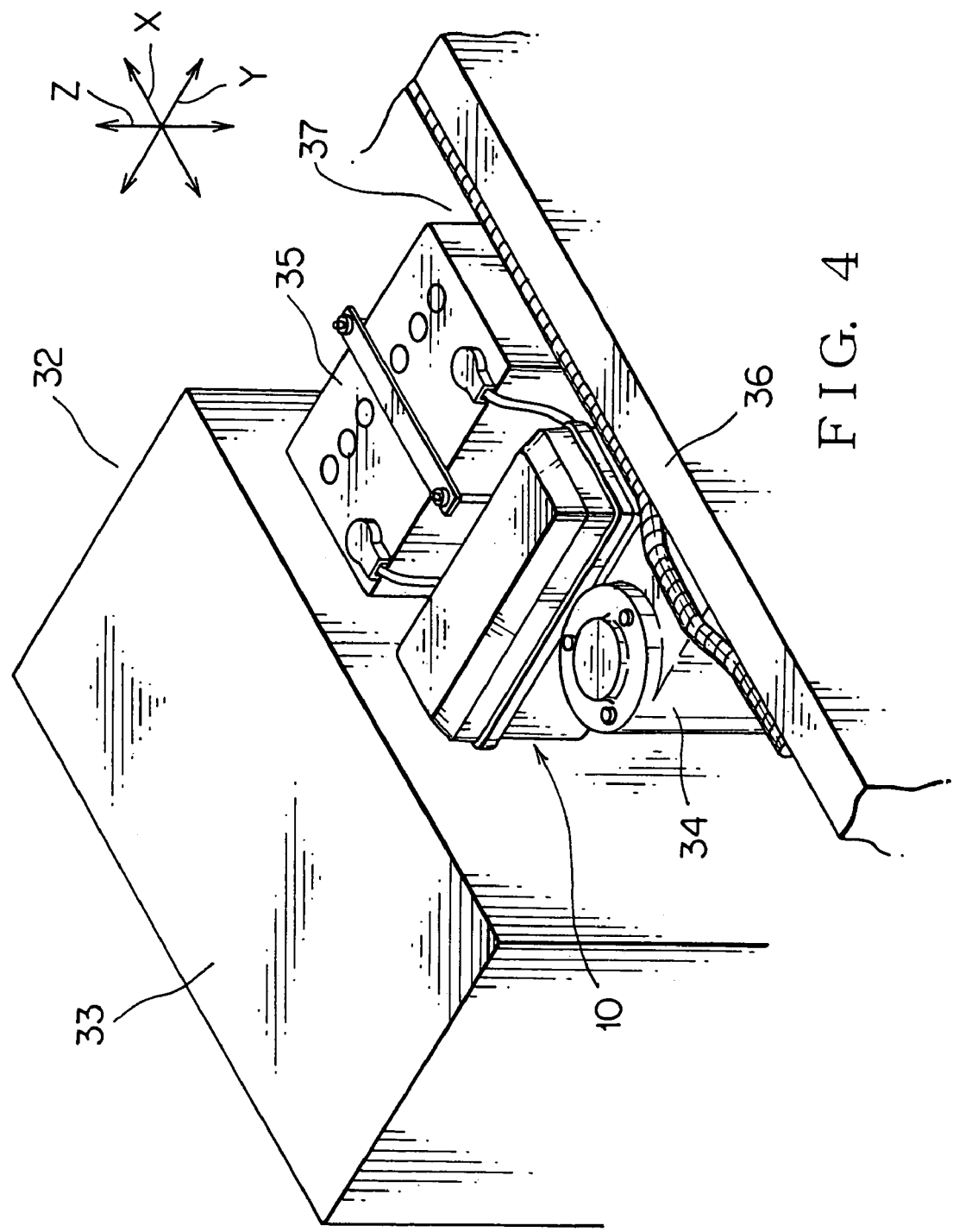
FIG. 4 is a perspective view for showing a junction box arranged in a vehicle engine room.
Figure 5:
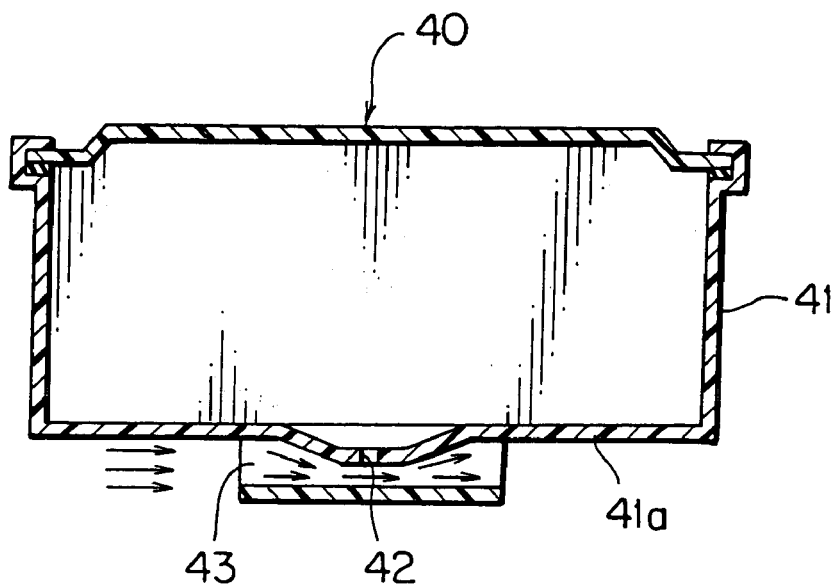
FIG. 5 is a sectional view showing a conventional junction box.
Figure 6:
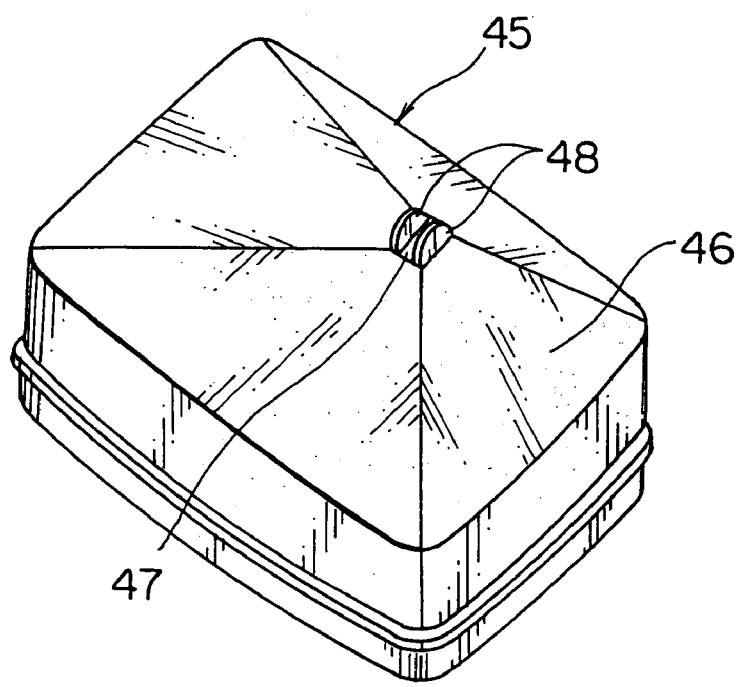
FIG. 6 is a perspective view showing another conventional junction box.

As shown in FIG. 4, the relay box 10 of the embodiment is disposed and secured laterally in a narrow space surrounded by an engine 33, a suspension tower 34, a battery 35, and the tire recess wall 36 within the engine room 32. Three sides except the tire case side each have little clearance with a labyrinth construction, allowing a minimum external water to reach the relay box 10. On the contrary, in the side of the tire recess wall 36, there is provided an arrangement space for a wiring harness 31, so that an external splashing water 30 may enter the space. The splashing water 30 forwarded into the space adjacent to the tire recess wall 36 is plashed by a wall of the tire recess wall 36 and a bottom surface 32a of the engine room 32 to reach the relay box 10.

Figure 1:
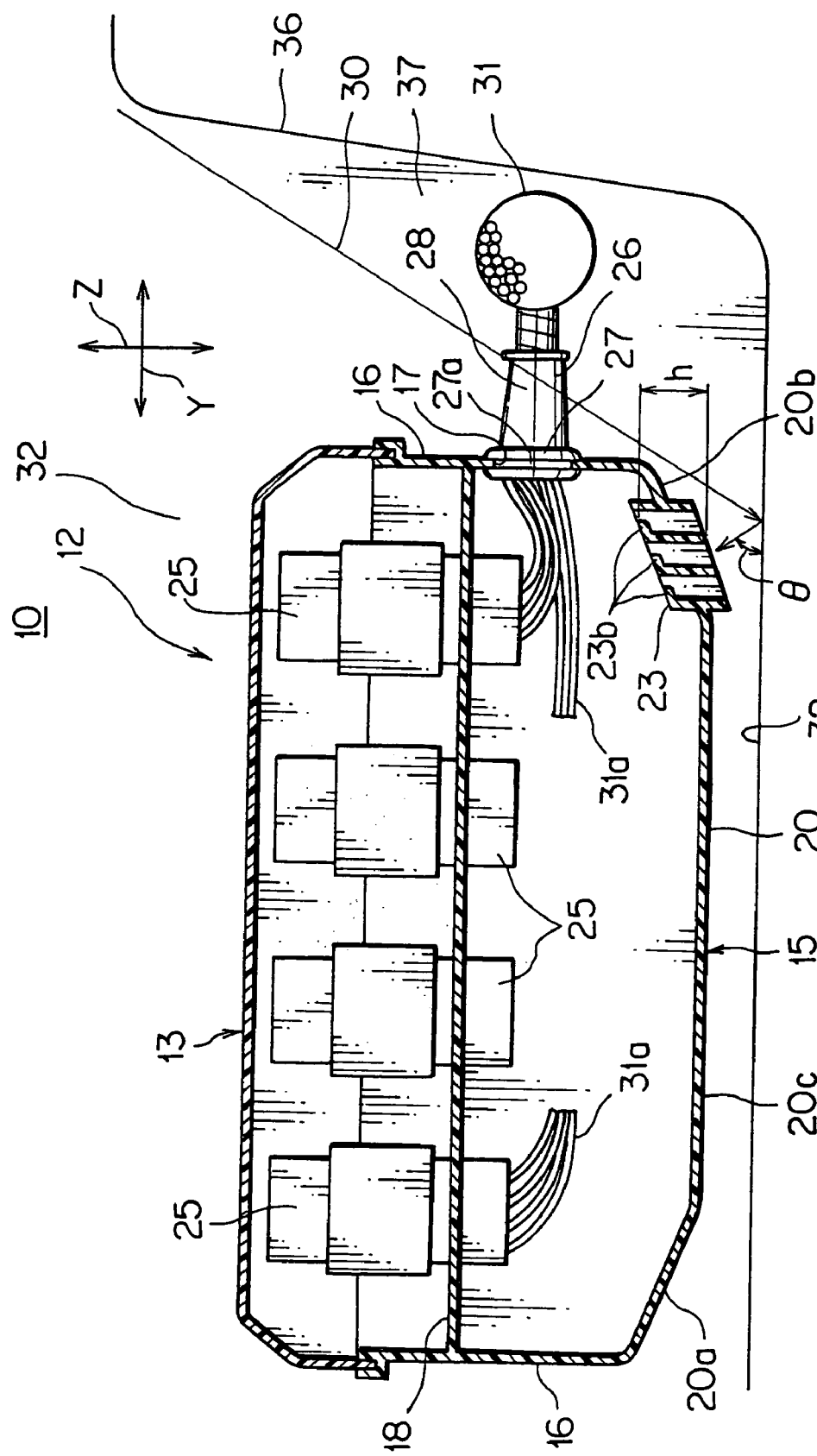
FIG. 1 is a sectional view showing an embodiment of a junction box according to the present invention.

As shown in FIG. 1, the relay box 10 has a lower cover 15 of which a bottom wall 20 is formed with a vent piece 23 extended from the bottom wall 20 for venting inner heat. The splashing water 30 plashed on the bottom surface 32a reaches the vent piece 23 at an angle θ that is limited within a range.

The relay box 10 of the embodiment can effectively vent air heated by relays 25 and also prevent invasion of an external water. That is, the relay box 10 keeps waterproofness with sufficient ventilation of a heated air. The housing 12 of the relay box 10 has the lower cover 15 formed with a plurality of the vent pieces 23. The vent pieces 23 are extended from the bottom wall 20 of the housing 12. Each vent piece 23 has a baffle projection 23b projected from an inner end portion of an inner wall 23a of the vent piece 23 for preventing invasion of the splashing water 30.

The baffle projection 23b partially closes the vent piece 23 to effectively prevent invasion of the splashing water 30, and the vent piece 23 has a central axis CL inclined relative to an invasion direction of the splashing water 30.

Next, the relay box 10 will be discussed in detail concerning its major constitutions and operational effects thereof. In the discussion, a longitudinal direction X is parallel to a running direction of the vehicle or a laying direction of the wiring harness 31. A front side is an area in which the suspension tower 34 is positioned, and a rear side is an area in which the battery 35 is positioned. A transverse direction Y is a width direction of the vehicle or an elongated direction of the relay box 10. A left side is an area in which the tire recess wall 36 is positioned, and a right side is an area in which the engine 33 is positioned. A vertical direction Z is a height direction of the vehicle or a height direction of the relay box 10. An upper side is an area in which an upper cover 13 of the relay box 10 is positioned, and a lower side is an area in which the lower cover 15 is positioned.

The relay box 10 is constituted by the housing 12 made of a resin material and a plurality of the relays 25 accommodated in the housing 12. Eight of the relays 25 are arranged in two longitudinal rows on a plate-shaped relay mounting plate 18 integrally formed with the housing 12. The relay mounting plate 18 may be formed separately from the housing 12 and secured to the housing 12 with fasteners. When separately formed, the relay mounting plate 18 constitutes a rely block together with the relays 25.

Generally, the relays 25 are mounted on the relay mounting plate 18 while the upper cover 13 of the housing 12 is open. Each relay 25 has four tab terminals (not shown). The wiring harness 31 has a plurality of electrical cables 31a electrically connected to the relays 25 via terminals. The electrical cables 31a connected to the relays 25 are gathered in a bundle wound with a tape. The bundle is led outward to merge into a main line of the wiring harness 31. The housing 12 has a harness outlet 17 attached with a waterproof grommet 26 to prevent invasion of an external water along the electrical cables 31a. The grommet 26 has a main body 27 and an extended tube 28 leading the electrical cables. The main body 27 has a through hole (not shown) and an annular groove 27a.

The housing 12 has a rectangular shape constituted by the lower cover 15 and the upper cover 13 overlaid on an upper opening of the lower cover 15. The upper cover 13, which is made of a resin material, defines a closed space of the housing 12 together with the lower cover 15. The closed space of the housing 12 prevents invasion of water and dust to protect the relays 25. The upper cover 13 is removably attached to the lower cover 15 by a fastening means such as securing screws or locking means.

The lower cover 15 has a peripheral wall 16, the bottom wall 20 contiguous with a lower end of the peripheral wall 16, and the relay mounting plate 18. The relay mounting plate 18 is positioned parallel to the bottom wall 20 a little above the bottom wall 20. From the upper opening of the lower cover 15, the relays 25 are mounted on the relay mounting plate 18. The peripheral wall 16 is formed with the harness outlet 17 in a side opposed to the tire recess wall 36. The peripheral wall 16 is also formed with a harness introducing hole (not shown) in a side opposed to the battery 35. Like the harness outlet 17, the harness introducing hole is attached with a waterproof grommet 26 to seal the housing 12. The bottom wall 20 is positioned opposite to the bottom surface 32a of the engine room 32 and has left and right inclined parts 20a, 20b together with a flat plate 20c. The inclined parts 20a, 20b are contiguous with the flat plate 20c and also contiguous with a lower end of the peripheral wall 16 at left and right sides thereof. The inclined parts 20a, 20b lead a drainage on the bottom wall 20 in which a drain hole (20d) is formed to discharge the drainage. The bottom wall 20 of the lower 14 may be defined in a funnel shape to collect the drainage at a central portion of the bottom wall 20 where the drain hole is positioned.

In a side opposite to the engine 33, there are provided the plurality of vent pieces 23 for ventilating an air heated by the relays 25. The vent pieces 23 are extended in a vertical direction Z at the left inclined part 20b positioned in the side of tire recess wall 36. Since the vent pieces 23 are positioned in a side opposite to the engine 33, heat generated by the engine 33 is prevented to enter the housing 12 through the vent pieces 23. The vent pieces 23 are positioned in the side of the tire recess wall 36, where there is defined a straight clearance 37 extended in a direction X. This arrangement provides a smooth air flow passage, so that heat transfer from the relay box 10 through the vent pieces 23 is activated, improving heat transfer of the relay box 10.

Figure 3A:
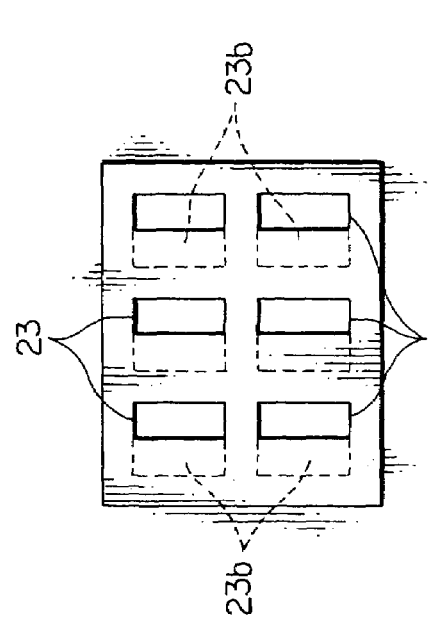
FIGS. 3A and 3B are respectively a perspective view taken in a direction P or Q.
Figure 3B:
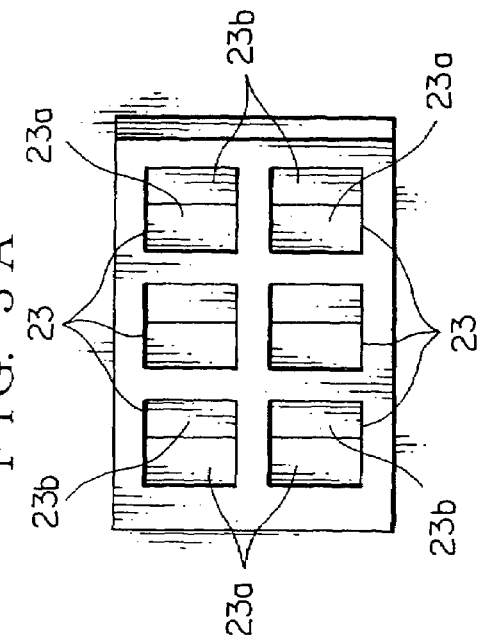

As shown in FIG. 3, the plurality of the vent pieces 23 are integrally arranged to define a grid. The vent pieces 23 totally activate heat transfer between the inside and the outside of the housing 12 as well as a larger single vent hole. Each vent piece 23 having a smaller sectional area limits invasion of the splashing water 30 into the splashing water 30. The eight vent pieces 23 do not intend to limit the present invention but may be changed in number.

The vent piece 23 is extended both inside and outside from the inclined part 20b, so that the vent piece 23 has a height such that the splashing water 30 hits an inner wall of the vent piece 23 with a larger probability. This restricts invasion of the splashing water 30 into the housing 12. The height of the vent piece 23 may be determined based on an invasion angle θ and a speed (kinetic energy) of the splashing water 30. The height of the vent piece 23 is larger than that of the drain hole 20d. In the embodiment, the height of the vent piece 23 is generally equal to a height h of the inclined part 20b.

The vent piece 23 has the baffle projection 23b extended inward from the inner wall 23a at an axial inner end of the vent piece 23. The baffle projection 23b orients parallel to inclined part 20b. The baffle projection 23b closes approximately a half of the sectional area of the vent piece 23. The projected length of the baffle projection 23b is determined such that the splashing water 30 advancing in a direction Q hits the baffle projection 23b.

Figure 2:
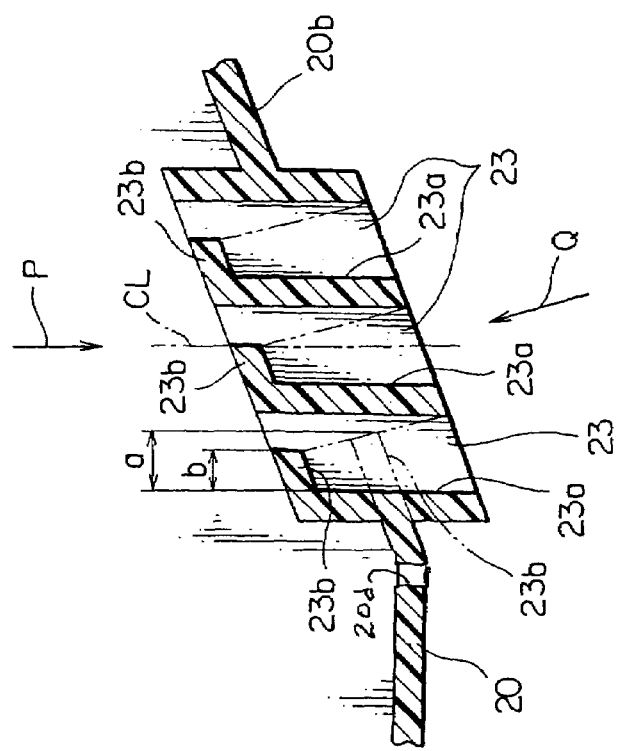
FIG. 2 is an enlarged sectional view showing a vent piece of the junction box of FIG. 1.

FIG. 2 shows the baffle projection 23b illustrated by a solid line and positioned at the inner end of the vent piece 23. Alternatively, the baffle projection 23b may be positioned at a middle of the vent piece 23 as illustrated by a chain line. To prevent invasion of the splashing water 30 into the housing 12, a projected length a of the baffle projection 23b positioned at the middle becomes larger than a projected length b of the baffle projection 23b positioned at the inner end.

The baffle projection 23b may be positioned at any position of the inner wall 23a of the vent piece 23. However, a larger projected length of the baffle projection 23b causes a narrower opening area of the vent piece 23 to degrade the vent piece 23 in heat transfer. The vent piece 23 having the narrower opening area is disadvantageous for forming the lower cover 15 by injection molding from a resin material. Accordingly, the baffle projection 23b positioned at the inner end of the vent piece 23 can have a smaller projecting length with a sufficient heat transfer performance.

The vent piece 23 has a central axis CL inclined relative to the advancing direction Q of the splashing water 30. Thus, the splashing water 30 hits the inner wall 23a and the baffle projection 23b of the vent piece 23 to prevent invasion of the splashing water 30 into the lower cover 15. In other words, against the splashing water 30 diagonally entering the side of tire recess wall 36 of the engine room 32, the vent piece 23 effectively keeps waterproofness of the housing 12.

The baffle projection 23b positioned at the inner end of the vent piece 23 helps to make molding dies simpler, improving workability in handling of the molding dies.

As discussed above, the relay box 10 of the embodiment is provided with the vent piece 23 for transferring heat outward, and the vent piece 23 has the baffle projection 23b to return the splashing water 30. The vent piece 23 has a height so that the splashing water 30 hits the inner wall 23a of the vent piece 23 to decrease kinetic energy of the splashing water 30. Furthermore, the plurality of vent pieces 23 each having a smaller diameter are better to prevent invasion of the vent piece 23. The vent piece 23 has a minimum size to keep a sufficient heat transfer performance. As a result, the embodiment provides a waterproof junction box improved in practical use.

The present invention is not limited in the aforementioned embodiment but may be modified as follows:

(1) The vent piece 23 may be extended only inward so as to be flush with an outer surface of the bottom wall 20. This eliminates a projection on the bottom wall 20 to prevent interference thereof.

(2) The vent piece 23 may be outwardly progressively smaller in sectional area to provide a narrower open end, improving a waterproof performance of the relay box 10.

What is claimed is:

1. A waterproof housing of a junction box disposed in an engine room of an automobile vehicle, wherein the housing is provided with at least one vent piece penetrating through a bottom wall of the housing, and extending inside of the bottom wall of the housing, providing heat transfer of the junction box, and the vent piece has an inner wall formed with a baffle projection to prevent invasion of a splashing water, the baffle projection positioned at an axial inner end portion of the vent piece, inside the housing, the vent piece having a central axis inclined relative to an invasion direction of expected splashing water.

2. The waterproof housing recited in claim 1 comprising a plurality of the vent pieces.

3. The waterproof housing recited in claim 1 further comprising a drain hole provided in the housing, wherein the vent piece has an inside opening positioned higher than the drain hole when the junction box is at a usage position.

* * * * *